(12) United States Patent
Kurasawa et al.

(10) Patent No.: US 9,652,103 B2
(45) Date of Patent: May 16, 2017

(54) DETECTION DEVICE AND DISPLAY DEVICE WITH DETECTION FUNCTION

(71) Applicant: Japan Display Inc., Tokyo (JP)

(72) Inventors: Hayato Kurasawa, Tokyo (JP); Keisuke Asada, Tokyo (JP); Tatsuya Ide, Tokyo (JP); Koji Ishizaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/947,563

(22) Filed: Nov. 20, 2015

(65) Prior Publication Data
US 2016/0291723 A1 Oct. 6, 2016

(30) Foreign Application Priority Data
Nov. 26, 2014 (JP) ................. 2014-238746

(51) Int. Cl.
| | | |
|---|---|---|
| *G06F 3/045* | (2006.01) | |
| *G06F 3/044* | (2006.01) | |
| *G02F 1/1333* | (2006.01) | |
| *G06F 3/041* | (2006.01) | |
| *H05K 1/11* | (2006.01) | |

(Continued)

(52) U.S. Cl.
CPC .......... *G06F 3/044* (2013.01); *G02F 1/13338* (2013.01); *G06F 3/0412* (2013.01); *H05K 1/117* (2013.01); *H05K 3/28* (2013.01); *H05K 3/361* (2013.01); *H05K 2201/0969* (2013.01); *H05K 2201/09263* (2013.01); *H05K 2201/09663* (2013.01); *H05K 2201/09681* (2013.01); *H05K 2201/09727* (2013.01)

(58) Field of Classification Search
CPC ....... G06F 3/044; G06F 3/0412; H05K 1/117; H05K 3/28; H05K 3/361; H05K 2201/09263; H05K 2201/09663; H05K 2201/09681; H05K 2201/0969; H05K 2201/09727; G02F 1/13338
See application file for complete search history.

(56) References Cited

U.S. PATENT DOCUMENTS

| | | |
|---|---|---|
| 2003/0179551 A1 | 9/2003 | Sugimoto et al. |
| 2011/0212661 A1* | 9/2011 | Lee .......... G06F 3/044 445/24 |

FOREIGN PATENT DOCUMENTS

| | | |
|---|---|---|
| JP | 2004-006632 A | 1/2004 |
| JP | 2008-112911 A | 5/2008 |

* cited by examiner

*Primary Examiner* — Adam R Giesy
(74) *Attorney, Agent, or Firm* — Michael Best & Friedrich LLP

(57) ABSTRACT

[Problem] To prevent detachment of overcoat layer which covers at least a part of a terminal formed on a substrate.
[Measure to solve the problem] According to one embodiment, a detection device includes a substrate, detection electrode, terminal formed of a metal material, lead, coating layer, conductive adhesion layer, and circuit board. The lead connects the electrode and the terminal. The coating layer covers the electrode and the lead, and partly covers the terminal. The adhesion layer covers a part of the terminal exposed from the coating layer and covers a part of the coating layer. The circuit board is connected to the terminal with the adhesion layer interposed therebetween. At least in an overlapping area where the conductive adhesion layer covers the coating layer, the metal material that forms the terminal includes a shape that the metal material is partly removed.

20 Claims, 12 Drawing Sheets

(51) Int. Cl.
*H05K 3/28* (2006.01)
*H05K 3/36* (2006.01)

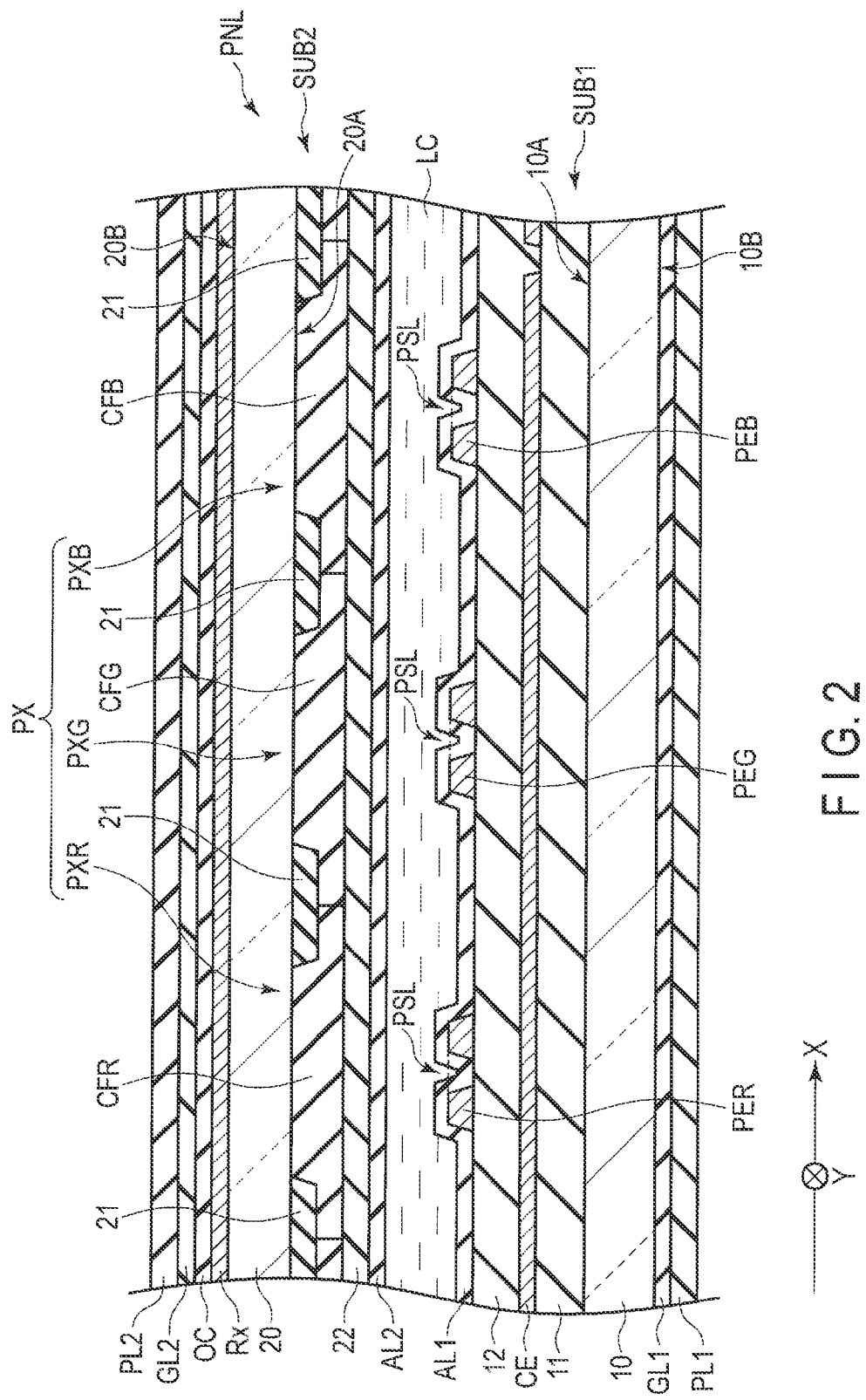
F I G. 2

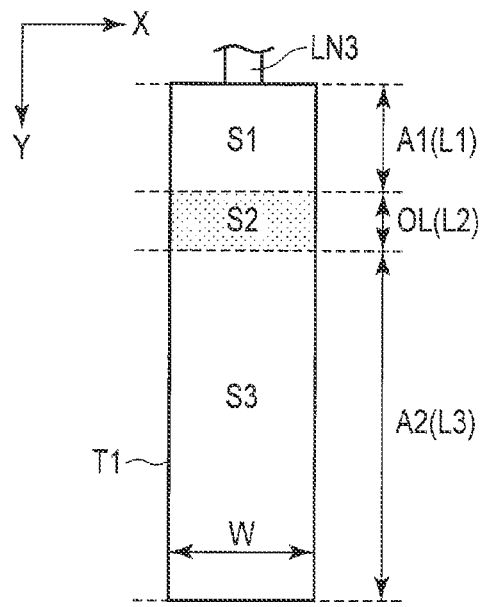
F I G. 8
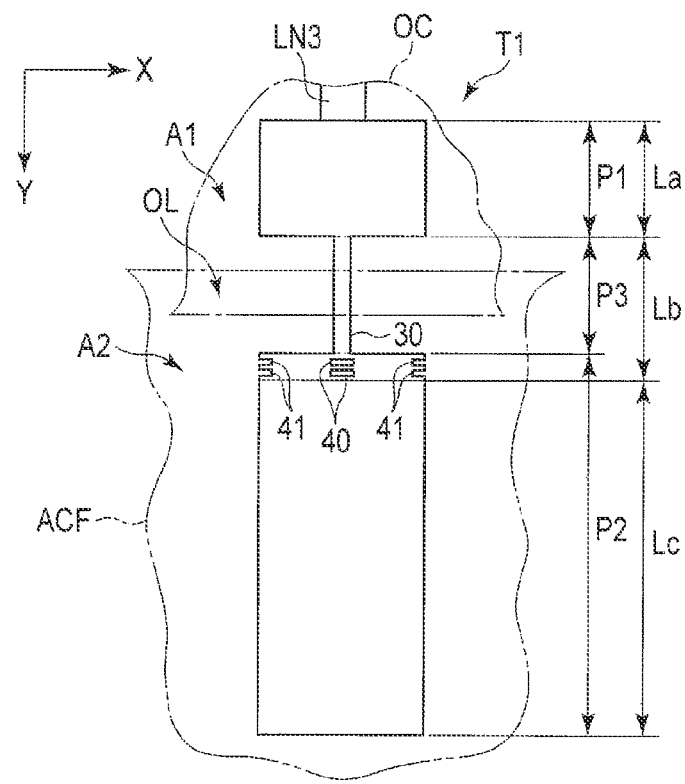
F I G. 9

| W1 (μm) | W2 (μm) | LX1 (μm) |
|---|---|---|
| 100 | 120 | 92 |
| | 105 | 85 |
| | 95 | 52 |
| | 50 | 30 |
| | 25 | 18 |
| | 18 | 2 |
| | 10 | 1 |
| 50 | 60 | 71 |
| | 50 | 25 |
| | 40 | 19 |
| | 30 | 16 |
| | 20 | 12 |
| | 10 | 3 |
| | 5 | 1 |

| W1 (μm) | W3 (μm) | LX2 (μm) |
|---|---|---|
| 120 | 125 | 89 |
|  | 115 | 65 |
|  | 90 | 40 |
|  | 50 | 29 |
|  | 30 | 7 |
|  | 15 | 1 |
|  | 10 | 0 |
| 60 | 65 | 59 |
|  | 55 | 24 |
|  | 40 | 21 |
|  | 30 | 20 |
|  | 20 | 9 |
|  | 10 | 1 |
|  | 5 | 0 |

DETECTION DEVICE AND DISPLAY DEVICE WITH DETECTION FUNCTION

TECHNICAL FIELD

The embodiments of this invention described herein relate to a detection device and a display device with a detection function.

BACKGROUND ART

Detection devices configured to detect an object touching or approaching a display area, and display devices with such a detection function are commercially used.

Such detection devices and display devices include, for example, a detection electrode for detecting an object, a terminal used for connection with a flexible printed circuit, and a lead configured to electrically connect the detection electrode and the terminal are formed on a substrate. The flexible printed circuit is electrically connected to the terminal via a conductive adhesion layer such as an anisotropy conductive layer.

If the lead, terminal, and detection electrode are formed of metal materials, advantages such as low resistivity can be achieved; however, metal materials are easily damaged and easily affected by water as compared to an indium tin oxide (ITO) or the like. In consideration of this point, the detection electrode, lead, and terminal must be partly covered with an overcoat layer of organic material, for example, to prevent damage and corrosion of the metal material.

Generally, adhesion of metal materials and an overcoat layer is weaker than adhesion of, for example, a glass substrate and an overcoat layer. Therefore, detachment of the overcoat layer may occur in detection devices with an overcoat layer or display devices with detection function.

PRIOR ART REFERENCES

Patent Documents

[Patent Document 1] JP-2008-112911-A
[Patent Document 2] JP-2004-6632-A

SUMMARY OF INVENTION

Problem that the Invention to Solve

An embodiment of the present application aims preventing detachment of overcoat layer which covers at least a part of a terminal formed on a substrate.

Measures to Solve the Problem

According to one embodiment of a detection device, the detection device includes a substrate, detection electrode, terminal, lead, coating layer, conductive adhesion layer, and circuit board. The detection electrode is formed on a main surface of the substrate. The terminal is formed of a metal material on the main surface. The lead is formed on the main surface and electrically connects the detection electrode and the terminal. The coating layer covers the detection electrode and the lead, and partly covers the terminal. The conductive adhesion layer covers a part of the terminal exposed from the coating layer and covers a part of the coating layer. The circuit board is electrically connected to the terminal with the conductive adhesion layer interposed therebetween. At least in an overlapping area where the conductive adhesion layer covers the coating layer, the metal material that forms the terminal includes a shape that the metal material is partly removed.

According to one embodiment of a display device with a detection function, the display device includes a display panel, a detection electrode, a terminal, a lead, a coating layer, a conductive adhesion layer, a circuit board and a detection circuit. The display panel includes a display element, a plurality of first electrodes disposed in respective pixels in a display area, and second electrodes opposed to the first electrodes, the display panel configured to display an image in the display area by selectively applying a voltage between the first electrodes and the second electrodes to drive the display element. The detection electrode is formed on an outer surface of the display panel. The terminal is formed of a metal material on the outer surface of the display panel. The lead is formed on the outer surface of the display panel and electrically connects the detection electrode, the lead and the terminal. The coating layer covers the detection electrode, the lead, and a part of the terminal. The conductive adhesion layer covering a part of the terminal exposed from the coating layer and covers a part of the coating layer. The circuit board is electrically connected to the terminal with the conductive adhesion layer interposed therebetween. The detection circuit is configured to detect the object based on a second signal output from the detection electrode to the circuit board through the lead and the terminal when a first signal for detection of the object is supplied to the second electrode. Further, at least in an overlapping area where the conductive adhesion layer covers the coating layer, the terminal has a shape that the metal material of the terminal is partially removed.

BRIEF EXPLANATION OF DRAWINGS

FIG. 2 is a cross-sectional view which schematically shows a liquid crystal display panel of the liquid crystal display device, and elements provided with the main surface of the liquid crystal display panel.

FIG. 8 shows an example of the shape of the terminal.

FIG. 9 shows a shape of the terminal of the first example.

EMBODIMENTS TO IMPLEMENT THE INVENTION

An embodiment will be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, the width, thickness, shape, and the like of each element are depicted schematically in the Figures as compared to actual embodiments for the sake of simpler explanation, and they are not to limit the interpretation of the invention of the present application. Furthermore, in the description and figures of the present application, structural elements having the same or similar functions will be referred to by the same reference numbers and detailed explanations of them that are considered redundant may be omitted.

In the present embodiment, a liquid crystal display device with detection function is disclosed as an example of the display device. For example, the liquid crystal display device can be used in various devices such as smartphones, tablet terminals, mobile phone terminals, personal computers, TVs, in-car devices, and game consoles. Note that a display panel of the display device with detection function is not limited to a liquid crystal display panel and may be display panels including different kind of display elements such as a self-luminous display panel including organic electroluminescent display elements, an electronic paper display panel including electrophoresis elements and the like.

Figure 1:
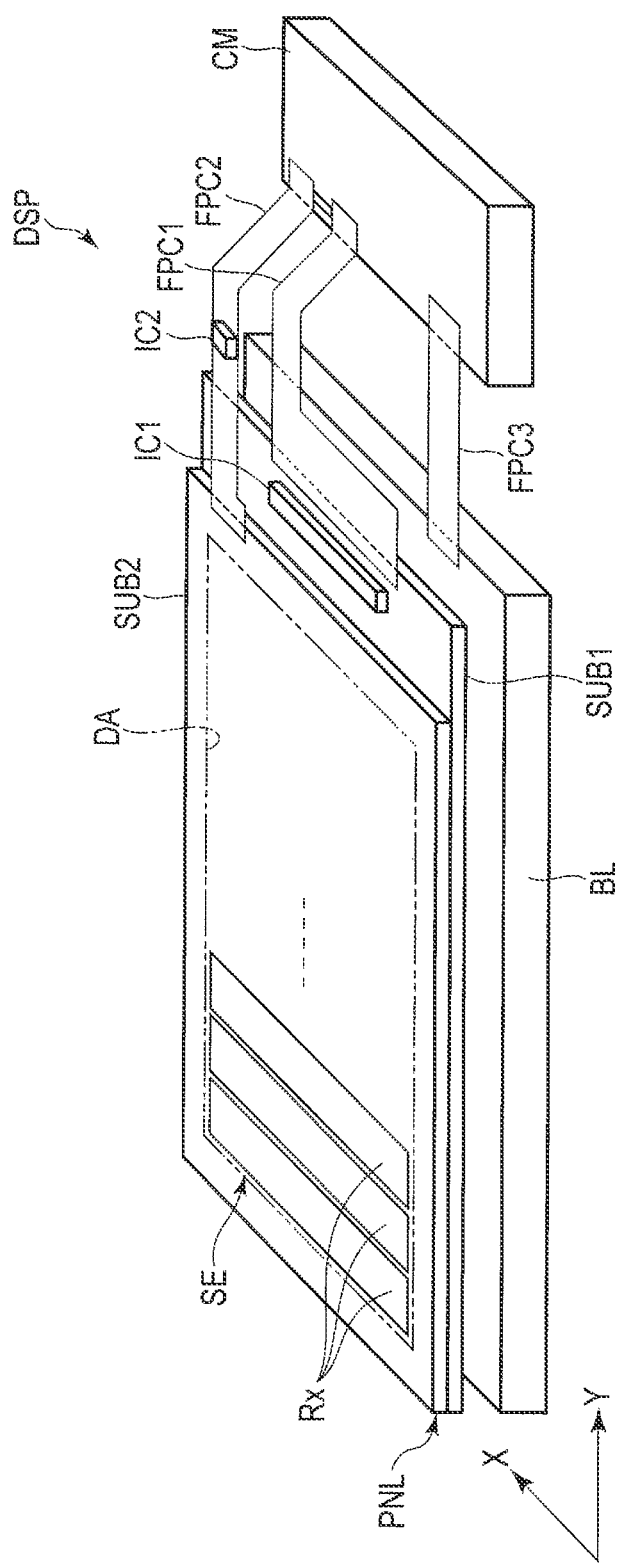
FIG. 1 is a perspective view which schematically shows the structure of a liquid crystal display device of an embodiment.

FIG. 1 is a perspective view which schematically shows the structure of a liquid crystal display device DSP of the present embodiment. As depicted, the liquid crystal display device DSP includes, for example, an active matrix type liquid crystal display panel PNL, a driver IC chip IC1 which drives the liquid crystal display panel PNL, a capacitive sensor SE, a driver IC chip IC2 which drives the sensor SE, a backlight unit BL which illuminates the liquid crystal display panel PNL, a control module CM, and flexible printed circuits FPC1, FPC2, and FPC3.

The sensor SE includes a plurality of detection electrodes Rx formed on the display surface of the liquid crystal display panel PNL.

Driver IC chip IC1 is mounted on the liquid crystal display panel PNL. Flexible printed circuit FPC1 connects the liquid crystal display panel PNL and the control module CM. Flexible printed circuit FPC2 connects at least a partial element of the sensor SE and the control module CM. Driver IC chip IC2 is mounted on the flexible printed circuit FPC2. The flexible printed circuit FPC3 connects the backlight unit BL and the control module CM.

The liquid crystal display panel PNL includes a first substrate SUB1, a second substrate SUB2 opposed to the first substrate SUB1, and a liquid crystal layer (the liquid crystal layer LC described later) held between the first substrate SUB1 and the second substrate SUB2.

The liquid crystal display panel PNL includes a display area DA by which images are displayed. In the example of FIG. 1, detection electrodes Rx are provided with the display area DA. The detection electrodes Rx extend in a first direction X and arranged along a second direction Y which crosses the first direction X. For example, the first direction X and the second direction Y are orthogonal to each other. The first and second directions may cross at any angle other than right angles.

The backlight unit BL is arranged at the rear surface side of the first substrate SUB1. The backlight unit BL can be achieved in various forms. For example, the backlight unit BL includes a light guide plate opposed to the first substrate SUB1 and a light source such as a light emitting diode (LED) arranged along the edges of the light guide plate.

FIG. 2 is a cross-sectional view which schematically shows the liquid crystal display panel PNL and elements provided with the main surface of the liquid crystal display panel PNL. The liquid crystal display panel PNL includes unit pixels PX (unit pixel area). One unit pixel PX is a minimum unit of a color image displayed on the display area DA.

FIG. 2 shows an example of unit pixel PX in which subpixels PXR, PXG and PXB (subpixel areas) corresponding colors of red, green and blue, respectively, are arranged in the first direction X. In the display area DA, a large number of unit pixels PX are arranged in a matrix. Note that the layout of the subpixels PXR, PXG and PXB of the unit pixel PX is not limited to the example of FIG. 2, and the three subpixels PXR, PXG and PXB are not necessarily arranged in the same direction. Furthermore, unit pixel PX may include a subpixel of a different color other than red, green and blue, that is, a white subpixel or the like.

As described above, the liquid crystal display panel PNL includes the first substrate SUB1, the second substrate SUB2 opposed to the first substrate SUB1, and the liquid crystal layer LC held between the first substrate SUB1 and the second substrate SUB2.

The first substrate SUB1 includes a first insulating substrate 10 which is a light transmissive glass substrate, light transmissive resin substrate, or the like. The first insulating substrate 10 has a first main surface 10A facing the second substrate SUB2 and a second main surface 10B which is opposite to the first main surface 10A.

Furthermore, the first substrate SUB1 includes a first insulating layer 11 covering the first main surface 10A of the first insulating substrate 10, a common electrode CE disposed on the first insulating layer 11, and a second insulating layer 12 covering the common electrode CE.

Furthermore, the first substrate SUB1 includes pixel electrodes PER, PEG and PEB corresponding to the subpixels PXR, PXG and PXB, respectively, and a first alignment layer AL1 which covers the pixel electrodes PER, PEG and PEB and the second insulating layer 12 and contacts the liquid crystal layer LC. The common electrode CE and the pixel electrodes PER, PEG and PEB are opposed to each other with the second insulating layer 12 interposed therebetween. In the example of FIG. 2, each of the pixel electrodes PER, PEG and PEB has a slit PSL.

The common electrode CE and the pixel electrodes PER, PEG and PEB are formed of a transparent conductive material such as indium tin oxide (ITO) or indium zinc oxide (IZO).

On the other hand, the second substrate SUB2 includes a second insulating substrate 20 which is a light transmissive glass substrate, light transmissive resin substrate, or the like. The second insulating substrate 20 has a first main surface 20A facing the first substrate SUB1, and a second main surface 20B which is opposite to the first main surface 20A. Furthermore, the second substrate SUB2 includes color filters CFR, CFG and CFB provided with the first main surface 20A of the second insulating substrate 20, and black matrix 21.

Color filter CFR is a red filter which is formed of a red resin material and disposed to correspond to the red subpixel PXR. Color filter CFG is a green filter which is formed of a green resin material and disposed to correspond to the green subpixel PXG. Color filter CFB is a blue filter which is formed of a blue resin material and disposed to correspond to the blue subpixel PXB.

The black matrix 21 defines subpixels PXR, PXG and PXB. Each boundary of the color filters CFR CFG, and CFB is placed on the black matrix 21.

Furthermore, the second substrate SUB2 includes a third insulating layer 22 covering the color filters CFR, CFG, and CFB and the black matrix 21, and the second alignment layer AL2 which covers the third insulating layer 22 and contacts the liquid crystal layer LC.

In the example of FIG. 2, a first polarizing plate PL1 and a first adhesive layer GL1 are provided with the second main surface 10B of the first insulating substrate 10. The first polarizing plate PL1 is adhered to the second main surface 10B by the first adhesive layer GL1.

Furthermore, in the example of FIG. 2, the detection electrodes Rx, the overcoat layer OC (protective film), the second polarizing plate PL2, and the second adhesive layer GL2 are provided with the second main surface 20B of the second insulating substrate 20. Note that phase-difference plates may be disposed between the first polarizing plate PL1 and the first insulating substrate 10, and between the second polarizing plate PL2 and the second insulating substrate 20.

The overcoat layer OC covers the detection electrodes Rx. The overcoat layer OC may be formed of an organic material such as polyimide, acrylic resin, and epoxy resin.

The second polarizing plate PL2 is adhered to the overcoat layer OC by the second adhesive layer GL2. The first polarizing plate PL1 has a first axis of polarization and the second polarizing plate PL2 has a second axis of polarization, and these axes of polarization (absorption axes) are orthogonal to each other on the X-Y plane as in a crossed-Nicol state.

Note that the structure of FIG. 2 is applicable to, for example, a liquid crystal display panel PNL of transverse field mode which uses a transverse field substantially parallel to the main surface of the substrate in switching of liquid crystal molecules. However, the mode of the liquid crystal display panel PNL is not limited to the transverse field mode, and may be a vertical field mode, which uses a vertical field normal to the substrate surface in switching of liquid crystal molecules, such as twisted nematic (TN) mode and vertically aligned (VA) mode.

The sensor SE is composed of, for example, detection electrodes Rx and common electrodes CE. In that case, the common electrodes CE function as electrodes for display and also functions as driver electrodes for sensing. The structure and the operation of the sensor SE will be explained below.

Figure 3:
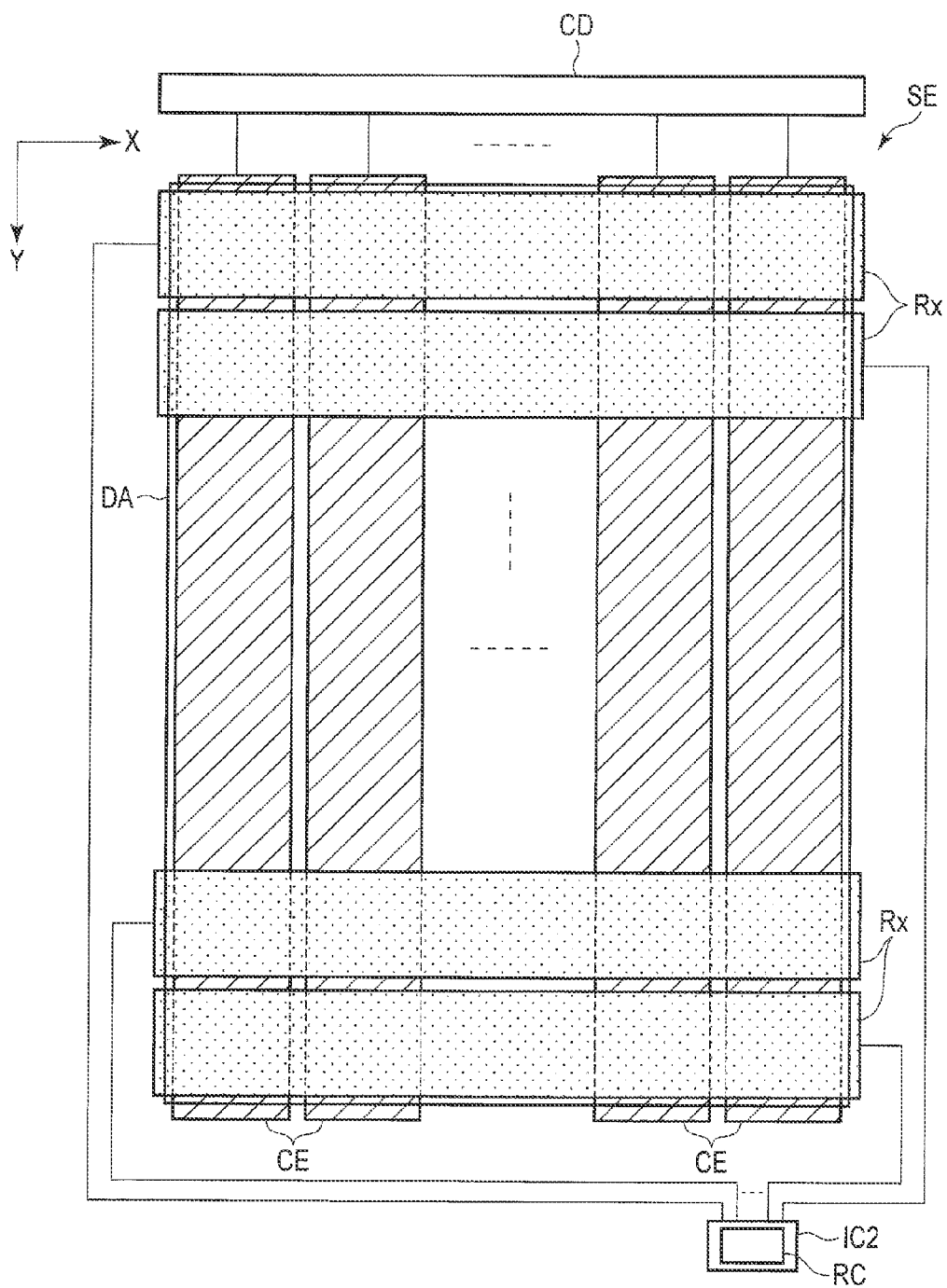
FIG. 3 shows a sensor of the liquid crystal display device.

FIG. 3 shows a sensor SE in a schematic plan-view of a positional relationship of detection electrodes Rx and common electrodes CE. In the example depicted, a display area DA is a rectangle having short sides parallel to the first direction X, and long sides parallel to the second direction Y. In the display area DA, detection electrodes Rx extend in the first direction X in stripes and are arranged along the second direction Y at certain intervals, and common electrodes CE extend in the second direction Y in stripes and are arranged along the first direction X at certain intervals.

The detection electrodes Rx are electrically connected to a detection circuit RC. The detection circuit RC is stored in, for example, the driver IC chip IC2. The detection circuit RC may be provided with the control module CM, or the like.

The common electrode CE is electrically connected to a common electrode driver circuit CD. The common electrode driver circuit CD is formed on the first substrate SUB1 outside the display area DA, for example.

The common electrode driver circuit CD selectively supplies common driving signals used for driving subpixels of each unit pixel PX and sensor driving signals used for driving the sensor SE to the common electrodes CE. For example, the common electrode driver circuit CD sequentially supplies common driving signals to each common electrode CE during a display period in which images are displayed on the display area DA and sensor driving signals to each common electrode CE during a sensing period in which an object contacting or approaching the display area DA is detected.

When the sensor driving signals are supplied, a first capacitance is produced between the common electrodes CE and the detection electrodes Rx. When a conductive object exists in the proximity of the display area DA, a second capacitance is produced between the object and the detection electrodes Rx. The second capacitance changes the first capacitance between the detection electrodes Rx in the proximity of the object and the common electrodes CE. Therefore, sensor output signals obtained from the detection electrodes Rx in the proximity of the object and sensor output signals obtained from the other part of the detection electrodes Rx show different values.

The detection circuit RC detects an object contacting or approaching the display area DA based on a change in the sensor output signals. Furthermore, the detection circuit RC can detect a position of contact or approach of an object within the display area DA.

Now, elements provided with the second main surface 20B of the second insulating substrate 20 will be explained in detail. Note that the second main surface 20B corresponds to one of the main surfaces of the liquid crystal display panel PNL including the display area DA.

Figure 4:
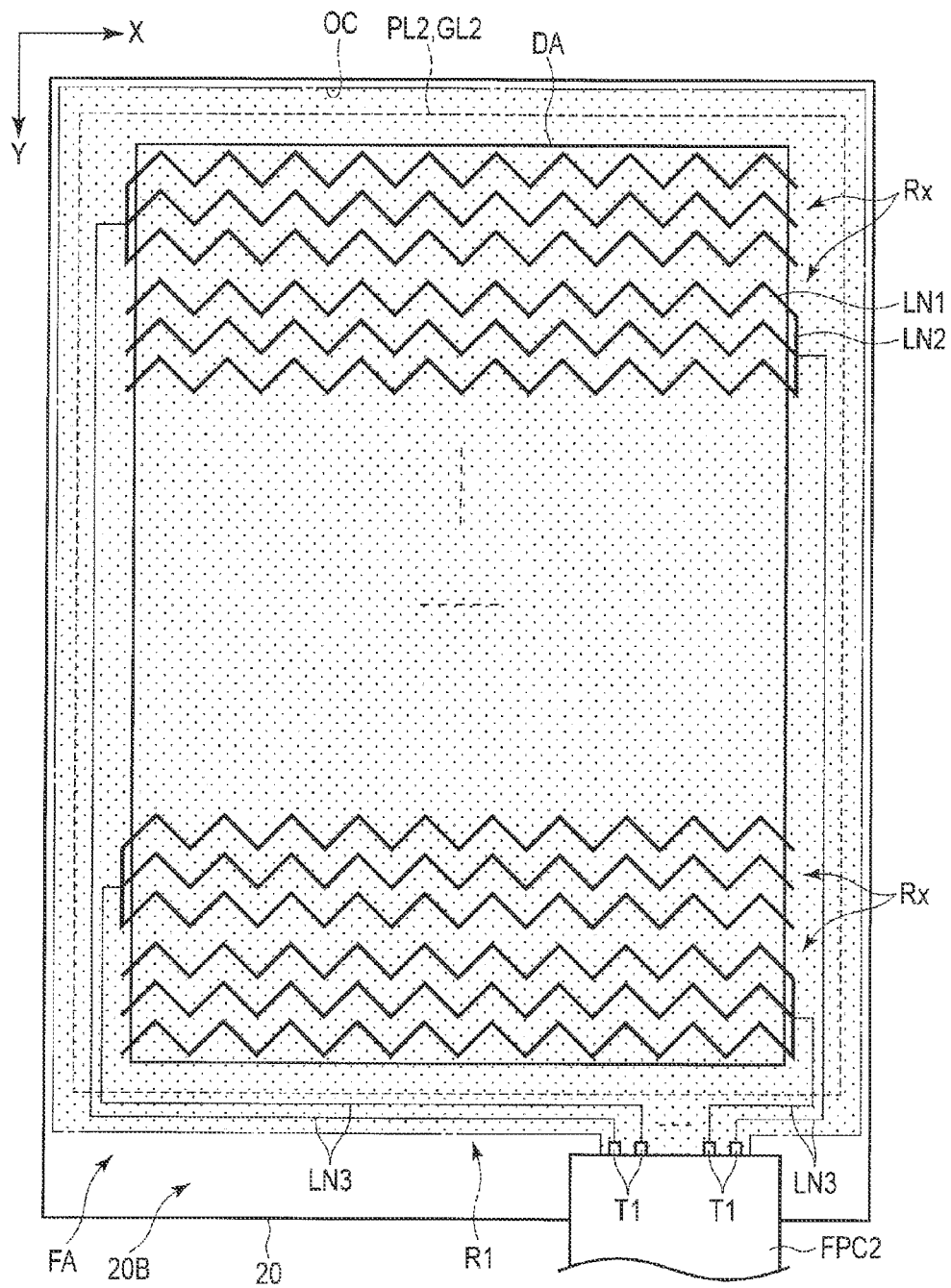
FIG. 4 is a plan view which schematically shows an example of elements provided with a main surface of an insulating substrate of the liquid crystal display panel.

FIG. 4 is a plan view which schematically shows the elements provided with the second main surface 20B of the second insulating substrate 20. In the example depicted, each detection electrode Rx includes a plurality of detection lines LN1 and a connection line LN2 connecting the detection lines LN1. The detection lines LN1 connected by the connection line LN2 each extend zigzag in the first direction X drawing a wave form (specifically, a triangular wave form) and arranged along the second direction Y at certain intervals.

Note that the structure of the detection electrodes Rx is not limited to the example of FIG. 4. For example, the detection electrodes Rx may be formed of metal lines crossed in a mesh-like manner. Furthermore, electrically floating dummy electrodes may be provided between detection electrodes Rx. Such a dummy electrode may be, for example, a detection line cut at an arbitral position and formed in a similar shape to the detection electrodes Rx.

A frame area FA is provided with the second main surface 20B to surround the display area DA from the outside thereof. In the frame area FA, a plurality of first terminals T1 and a plurality of leads LN3 used for one-to-one electrical connection between the detection electrodes Rx and the first terminals T1 are formed. In the example of FIG. 4, the first terminals T1 are arranged along the first direction X at certain intervals. Each first terminal T1 is electrically connected to the flexible printed circuit FPC2. Note that first terminal T1 may be referred to as pad.

The detection lines LN1, connection lines LN2, the leads LN3 and the first terminals T1 are, for example, integrally formed on the second main surface 20B, of the same metal material, and through the same manufacturing step. The metal material may be, for example, aluminum (Al), molybdenum (Mo), or an alloy containing either Al or Mo. Alternately, the detection lines LN1, the connection lines LN2, the leads LN3, and the first terminals T1 may be formed as a layered structure of a plurality of metal materials. For example, a layered structure of the detection lines LN1, the connection lines LN2, the leads LN3, and the first terminals T1 may be composed of six layers including an aluminum alloy interposed between molybdenum alloy barrier-metals and three films having different refractive indices placed on the alloys. Note that the number of the layers of the metal materials is not limited to six and may be reduced or increased.

The second polarizing plate PL2, second adhesive layer GL2, and overcoat layer OC are each formed in a rectangular shape covering the display area DA. In the example of FIG. 4, the second polarizing plate PL2 and the second adhesive layer GL2 are formed in the same shape and arranged on the second main surface 20B such that their peripheries match with each other. The periphery of the overcoat layer OC substantially matches with the periphery of the second insulating substrate 20 except for the side R1 where the first terminals T1 are provided with.

In the example of FIG. 4, the overcoat layer OC covers not only the display area DA but also the substantial part of the frame area FA. The overcoat layer OC covers the detection lines LN1 and the connection lines LN2 of the detection electrodes Rx, and the leads LN3. Furthermore, the overcoat layer OC covers a part of each first terminal T1. That is, each first terminal T1 is disposed on the second main surface 20B along one side (side R1) of the overcoat layer OC.

Figure 5:
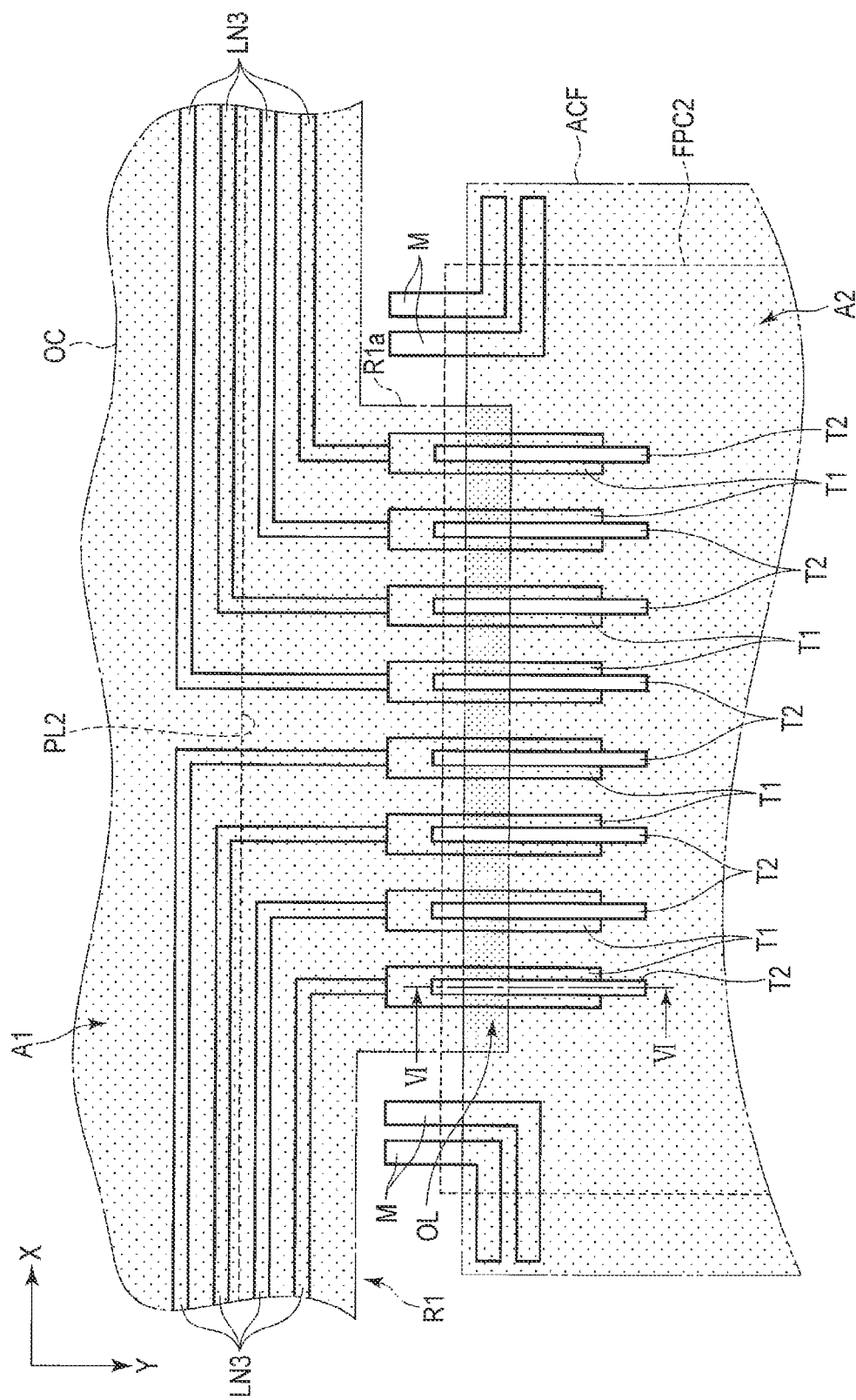
FIG. 5 shows a joint part of terminals and a flexible printed circuit formed on the main surface in an enlarged manner.

FIG. 5 shows the proximity of joint part of the first terminals T1 and the flexible printed circuit FPC2 in an enlarged manner. In the example depicted, eight first terminals T1 are arranged along the first direction X at certain intervals. The first terminals T1 extend along the second direction Y in stripes. Each first terminal T1 is connected to a lead LN3.

Alignment marks M are arranged in the proximity of the first terminals T1 as marks for positioning of the flexible printed circuit FPC2 in its implementation process. In the example of FIG. 5, two pairs of L-shaped alignment marks M are arranged in the proximity of the two outermost ones of the first terminals T1, respectively, with a certain gap therebetween along the first direction X. The alignment marks M are formed on the second main surface 20B, of the same material and through the same manufacturing process as those of the detection lines LM1, the connection lines LN2, the leads LN3, and the first terminals T1.

The overcoat layer OC has a projection R1a projecting from the side R1 along the second direction Y. The projection R1a extends to the proximity of the middle of the first terminals T1 to partly cover the first terminals T1. In the present embodiment, the projection R1a does not cover any alignment mark M.

The flexible printed circuit FPC2 includes a plurality of second terminals T2 electrically connected to the first terminals T1, respectively. The second terminals T2 are arranged along the first direction X at the same intervals of the first terminals T1, and extend in the second direction Y in stripes. An anisotropy conductive layer ACF is disposed between the flexible printed circuit FPC2 and the first terminals T1. The anisotropy conduction layer ACF is an example of a conductive adhesion layer. Each second terminal T2 faces the first terminal T1 corresponding to it with the anisotropy conductive layer ACF interposed therebetween. The anisotropy conductive layer ACF adheres the flexible printed circuit FPC2, the first terminals T1, and second main surface 20B, and electrically connects each pair of the first terminal T1 and the second terminal T2 opposed to each other.

The anisotropy conductive layer ACF partly covers the projection R1a of the overcoat layer OC. In the following description, an area of the overcoat layer OC covered by the anisotropy conductive layer ACF is referred to as overlap area OL. Furthermore, an area of the second main surface 20B which is covered by the overcoat layer OC and does not overlap the anisotropy conductive layer ACF in plan view is referred to as first area A1, and an area of the second main surface 20B which is covered by the anisotropy conductive layer ACF and does not overlap the overcoat layer OC in plan view is referred to as second area A2. In the example of FIG. 5, the overlap area OL has a substantially constant width in the second direction Y and extends in the first direction X. The area and position opposed to the overlap area OL are substantially the same in the first terminals T1.

Figure 6:
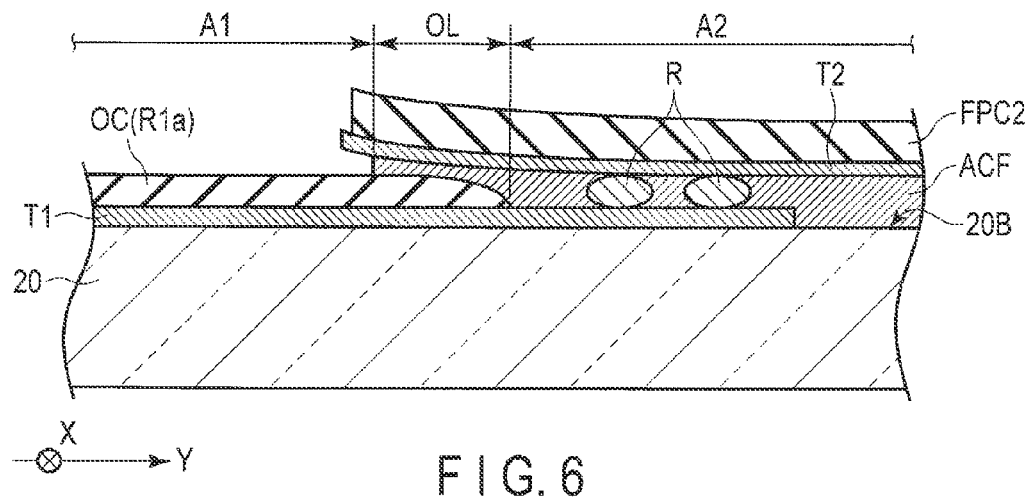
FIG. 6 schematically shows a cross-sectional view taken along line VI-VI of FIG. 5.

FIG. 6 schematically shows a cross-sectional view taken along the line VI-VI of FIG. 5. The first terminals T1 formed on the second main surface 20B of the second insulating substrate 20 are covered by the overcoat layer OC at the display area DA side (left side in the figure) while their tips (right side in the figure) are exposed from the overcoat layer OC. The parts of the first terminals T1 exposed from the overcoat layer OC are opposed to the second terminals T2 of the flexible printed circuit FPC2 with the anisotropy conductive layer ACF interposed therebetween.

The anisotropy conductive layer ACF contains a large number of anisotropy conductive particles R. The anisotropy conductive particle R is, for example, a sphere of a metal material covered with an insulating layer. When the flexible printed circuit FPC2 is applied on this layered structure, the flexible printed circuit FPC2 is initially placed on the anisotropy conductive layer ACF and then thermo-pressed thereon. In this process, the anisotropy conductive particles R are crashed between the first terminals T1 and the second terminals T2, and the internal metal materials of the particles R are exposed through their insulating layers. Accordingly, the first terminals T1 and the second terminals T2 are electrically conducted through the crashed particles R. Note that, in a plan view, the non-conduction between the first terminals T1 and second terminals T2 arranged alongside, the non-conduction between first terminals T1, and the non-conduction between second terminals T2 are all maintained.

In general, the adhesion between the first terminals T1 formed of a metal material and the overcoat layer OC is weaker than the adhesion between the second insulating substrate 20 formed of a material such as glass and the overcoat layer OC. Therefore, in the proximity of the first terminals T1, the detachment of the overcoat layer OC may adversely occur. Such detachment may occur when the flexible printed circuit FPC2 needs to be peeled off in, for example, a manufacturing or repairing process. Specifically, if a force is applied in the normal direction of the second main surface 20B for peeling off the flexible printed circuit FPC2, the same force is applied to the overcoat layer OC by the adhesion of the anisotropy conductive layer ACF within the overlap area OL. Since the adhesion between the first terminals T1 and the overcoat layer OC is weak, the overcoat layer OC may possibly be detached from the second main surface 20B or the first terminals T1 in the proximity of the first terminals T1.

The problem of the detachment of the overcoat layer OC is caused by another factor; the detection electrodes Rx formed on the outer surface of the liquid crystal display panel PNL (the second main surface 20B of the second insulating substrate 20). That is, the overcoat layer OC is formed by applying a resin material on the second main surface 20B through an ink-jet (droplet ejection) print process and curing the resin material thereon by heat treatment. In this heat treatment, the temperature is kept below a certain level in consideration of a possible damage to the liquid crystal layer LC or the like. The overcoat layer OC formed through the heat treatment of low temperature (approximately 120° C., for example) generally has a weaker adhesion to the second main surface 20B and the metal materials on the second main surface 20B as compared to the overcoat layer OC formed by high-temperature heat treatment (at approximately 220° C., for example).

If the overcoat layer OC is prepared through the above print process, the ends of the overcoat layer OC may be formed irregularly in the proximity of the first terminals T1 due to a difference between the wettability of the overcoat layer OC and that of the second main surface 20B and the metal materials.

Figure 7:
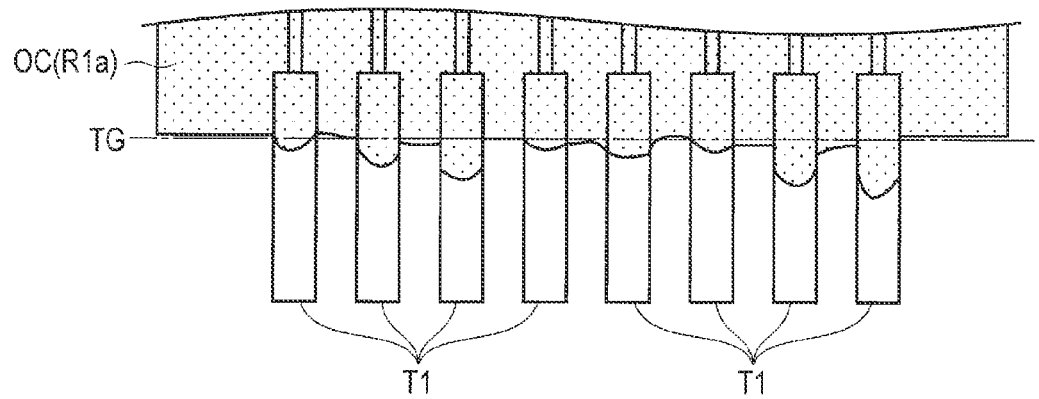
FIG. 7 shows an example of an end shape irregularity in an overcoat layer formed on the main surface.

FIG. 7 shows an example of the end shape irregularity of the overcoat layer OC in which a plurality of the first terminals T1 and the overcoat layer OC (projection R1a) covering the first terminals T1 are illustrated in a plan view. A dotted line indicated near the end of the overcoat layer OC is a designed target limit TG used for positioning of the end of the overcoat layer OC. The resin material of the overcoat layer OC is in a liquid state immediately after being applied to the second main surface 20B, and stops in the proximity of the target limit TG in the area where the first terminals T1 are not arranged. However, the resin material in a liquid state on the first terminals T1 flows toward their tips over the target limit TG because of the high wettability of the metal materials. Therefore, the overcoat layer OC spreads on the first terminals T1 and the end shape becomes irregular. The irregularity may prevent an electrical connection between the first terminals T1 and the second terminals T2.

In the present embodiment, the shape of the first terminal T1 is varied to prevent detachment and end shape irregularity of the overcoat layer OC. The shape of the first terminal T1 is now explained with reference to FIG. 8. The first terminal T1 is patterned such that the metal material thereof is partly removed from at least the part overlapping the overlap area OL (hatched part).

From a different standpoint, an area of metal material of the first terminal T1 per unit area in the overlap area OL (area arrangement ratio) is smaller than that of the other area. The length of the first terminal T1 in the second direction Y in the first area A1 is L1, the length of the first terminal T1 in the second direction Y in the overlap area OL is L2, and the length of the first terminal T1 in the second direction Y in the second area A2 is L3. The width of the first terminal T1 in the first direction X is W. Furthermore, the area of the metal material of the first terminal T1 in the first area A1 is S1, the area of the metal material of the first terminal T1 in the overlap area OL is S2, and the area of the metal material of the first terminal T1 in the second area A2 is S3. In that case, the area arrangement ratio is defined as, for example, $S1/(L1 \times W)$, $S2/(L2 \times W)$, and $S3/(L3 \times W)$ wherein $S2/(L2 \times W) < S1/(L1 \times W)$, $S3/(L3 \times W)$. If the width W is not constant, the area arrangement ratio may be defined as $S1/L1$, $S2/L2$, and $S3/L3$. In that case, $S2/L2 < S1/L1$, $S3/L3$.

If the above first terminal T1 is adopted, the contact area of the overcoat layer OC and the second main surface 20B which is firmly adhesive to the overcoat layer OC can be increased within the overlap area OL to which the detachment force is applied during peeling off of the flexible printed circuit FPC2. Consequently, the overcoat layer OC is not easily detached. Furthermore, the resin material of the overcoat layer OC applied on the first terminals T1 is less fluid in the area where the metal material is partly removed since the contact area between the resin material and the metal material is reduced. Therefore, the end shape irregularity of the overcoat layer OC can be prevented.

Hereinafter, some variations of the shape of the first terminal T1 are presented. In each example, the same or similar elements are referred to by the same reference number and redundant explanation is omitted.

First Example

FIG. 9 shows the shape of the first terminal T1 of the first example. The first terminal T1 includes a first part P1 which is covered with the overcoat layer OC and does not overlap the anisotropy conductive layer ACF in a plan view, a second part P2 which is covered with the anisotropy conductive layer ACF and does not overlap the overcoat layer OC in a plan view, and a third part P3 which at least partly overlaps the overlap area OL in a plan view and connects the first part P1 and the second part P2. In the example of FIG. 9, the first part P1 is in the first area A1, the second part P2 is in the second area A2, and the third part P3 includes the first area A1, overlap area OL, and second area A2.

In the present example, the third part P3 has a line 30 whose width in the first direction X is less than the first part P1, the second part P2 and the lead LN3. In the example of FIG. 9, the first part P1 and the second part P2 have the same width which is greater than that of the line 30. The line 30 extends in the second direction Y and connects the first part P1 and the second part P2. The third part P3 having such a line 30 is an example of the above-described patterned structure.

The second part P2 has an opening 40 on the extension line of the line 30. Furthermore, the second part P2 has notches 41 on both edges thereof in the first direction X. In the example of FIG. 9, two openings 40 and two notches 41 are formed successively in the second direction Y. The openings 40 and the notches 41 are to prevent the resin material of the overcoat layer OC from reaching the second part P2. That is, even if the resin material of the overcoat layer OC applied on the second main surface 20B flows toward the second part P2 along the line 30, the flowing resin material is trapped by the openings 40 formed on the extension line of the line 30 and the notches 41 at the both sides of the second part P2. Therefore, good conductivity can be secured between the second part P2 and the flexible printed circuit FPC2.

The size of each of the first part P1, the second part P2, and third part P3 should be determined based on factors such as tolerances of the overcoat layer OC and the anisotropy conductive layer ACF. For example, a tolerance of the edge of the overcoat layer OC is approximately ±0.1 mm, a tolerance of the edge of the anisotropy conductive layer ACF is approximately ±0.225 mm, a length La of the first part P1 in the second direction Y is approximately 0.2 mm, a length Lb between the boundary of the first part P1 and the third part P3 and the outer edge of the openings 40 and the notches 41 in the second direction Y is approximately 0.25 mm, and a length Lc between the outer edge of the openings 40 and the notches 41 in the second direction Y and the end of the second part P2 in the second direction Y is approximately 0.6 mm.

Second Example

Figure 10:
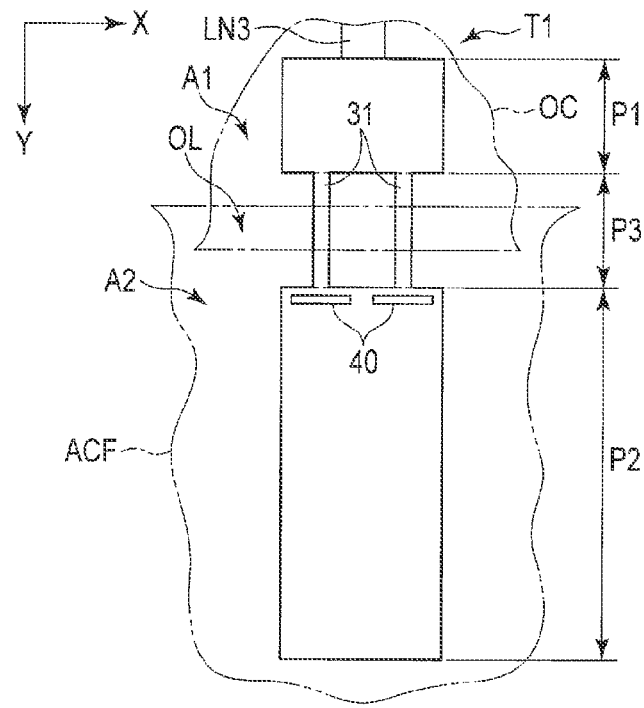
FIG. 10 shows a shape of the terminal of the second example.

FIG. 10 shows a shape of the first terminal T1 of the second example. The first terminal T1 includes the first part P1, the second part P2, and the third part P3 as in the first example.

In this example, the third part P3 has two lines 31. In the example of FIG. 10, the two lines 31 have the same width in the first direction X which is less than the width of the lead LN3. The two lines 31 extend in the second direction Y and connect the first part P1 and the second part P2. The third part P3 having such lines 31 is another example of the above-described patterned structure.

The second part P2 has openings 40 formed on the extension lines of the lines 31. A plurality of the openings 40 may be formed in the second direction Y as in the example of FIG. 9.

If the two-line structure as in this example is adopted, the first part P1 and the second part P2 are connected through multiple paths, and conduction between the first part P1 and the second part P2 is secured even if one of the lines 31 is cut for some reason.

In this example, the first part P1 and the second part P2 are connected through two lines 31; however, the number of lines 31 is not limited thereto. The first part P1 and the second part P2 may be connected through three or more lines 31.

Third Example

Figure 11:
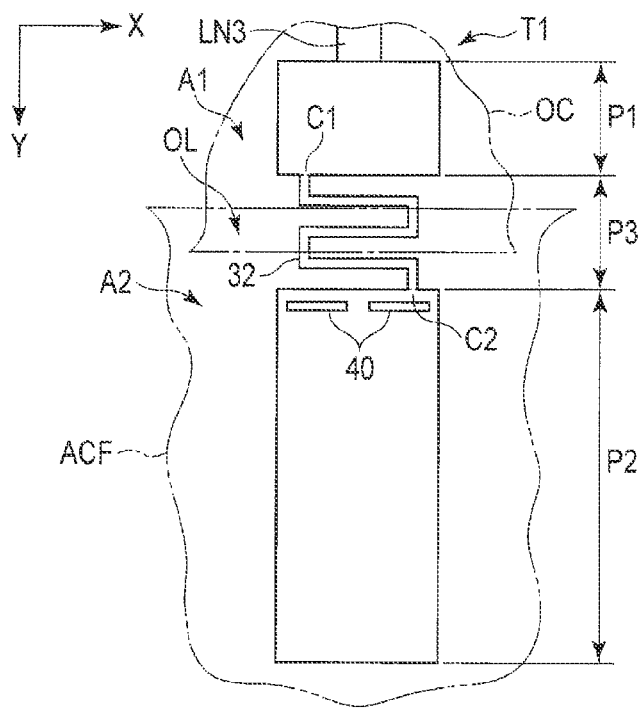
FIG. 11 shows a shape of the terminal of the third example.

FIG. 11 shows a shape of the first terminal T1 of the third example. The first terminal T1 includes the first part P1, the second part P2, and the third part P3 as in the first example.

In this example, the third part P3 has a line 32 bent several times. In the example of FIG. 11, the line 32 starts from the connection point in the first part P1 extending in the second direction Y, then repeats bending by approximately 90° several times, and finally extends in the second direction Y to reach the second part P2. The third part P3 having such a line 32 is another example of the above described patterned structure.

In the example of FIG. 11, the width of the line 32 is substantially the same over its entirety and is less than the width of the lead LN3. A connection point C1 of the line 32 and the first part P1 and a connection point C2 of the line 32 and the second part P2 are apart in the first direction X.

The second part P2 has openings 40 on both the extension line of the line 32 extending from the connection point C1 in the second direction Y and the extension line of the line 32 extending to the connection point C2 in the second direction Y. A plurality of the openings 40 may be formed more in the second direction Y as in the example of FIG. 9.

If the second part P2 includes a bending line 32 as in this example, the parts where the overcoat layer OC and the second main surface 20B contact with each other can be dispersed in the proximity of the overlap area OL. Consequently, a possibility of detachment of the overcoat layer OC can further be decreased. Even if the resin material of the overcoat layer OC flows in the second direction Y, the resin material is trapped by the bending line 32. Furthermore, even if the resin material flows on the line 32, the flow can be stopped by the bent parts.

In this example, the line 32 bends by approximately 90°; however, the angle is not limited thereto. The line 32 may bend into an acute or obtuse angle. The line 32 may meander in arcs. The same advantage can be achieved in this case.

Fourth Example

Figure 12:
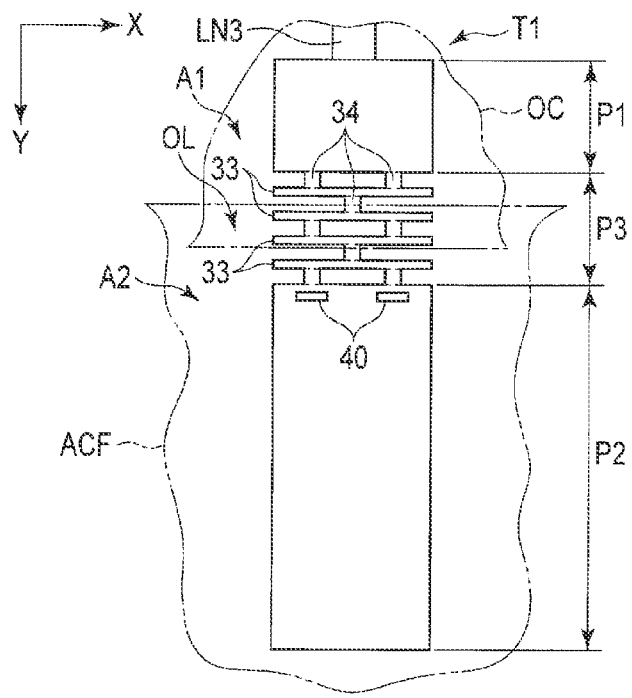
FIG. 12 shows a shape of the terminal of the fourth example.

FIG. 12 shows a shape of the first terminal T1 of the fourth example. The first terminal T1 includes the first part P1, the second part P2, and the third part P3 as in the first example.

In this example, the third part P3 has a plurality of lines 33 extending in the first direction X and a plurality of connectors 34. The connectors 34 are arranged between adjacent lines 33 for the connection. Furthermore, the connectors 34 are arranged between the first part P1 and the nearest line to the first part P1 and between the second part P2 and the nearest line to the second part P2 for the connection. The third part P3 having such lines 33 and connectors 34 is another example of the above-described patterned structure.

In the example of FIG. 12, the width of the line 33 in the second direction Y and the width of the connector 34 in the first direction X are less than the width of the lead LN3.

If the resin material of the overcoat layer OC is applied by the ink-jet application process, some areas surrounded by the lines 33 and connectors 34 may be missed and such areas do not include an overcoat layer OC. Therefore, the size of and gap between the lines 33 and the connectors 34 may be determined such that the areas surrounded by the lines 33 and connectors 34 become smaller than a pitch (resolution) of a droplet of the resin material sprayed from a head of an ink-jet device. For example, the pitch may be set to approximately 70 μm in both the first direction X and the second direction Y.

In the example of FIG. 12, the number of the connectors 34 connected to a long side of a line 33 at the first part P1 side is different from that at the second part P2 side (one and two connectors 34 are connected to the sides alternately). Furthermore, the connectors 34 connected to a long side of a line 33 at the first part P1 side are positioned to be shifted in the first direction X from the connectors 34 connected to a long side of the line 33 at the second part P2 side.

The second part P2 has an opening 40 in the proximity of each connection point of the connector 34 and the second part P2. A plurality of the openings 40 may be formed in the second direction Y as in the example of FIG. 9.

If the third part P3 is defined by the lines 33 and the connectors 34 as in this example, the parts where the overcoat layer OC and the second main surface 20B contact with each other can be dispersed in the proximity of the overlap area OL. Consequently, a possibility of detachment of the overcoat layer OC can further be decreased. Even if the resin material of the overcoat layer OC flows in the second direction Y, the resin material is trapped by the openings defined by the lines 33 and the connectors 34. Furthermore, even if the resin material flows on the lines 33 and the connectors 34, the flow can be stopped because the positions of the connectors 34 are not continuous in the second direction Y.

Fifth Example

Figure 13:
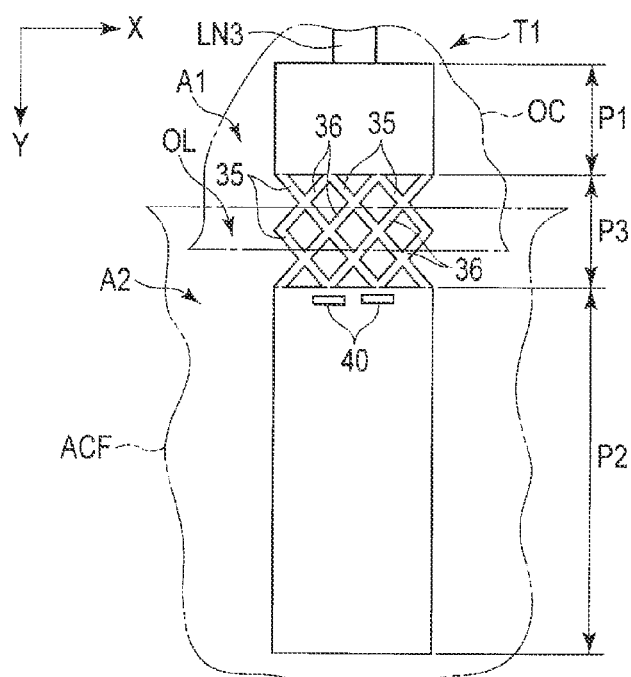
FIG. 13 shows a shape of the terminal of the fifth example.

FIG. 13 shows a shape of the first terminal T1 of the fifth example. The first terminal T1 includes a first part P1, second part P2, and third part P3 as in the first example.

In this example, the third part P3 has a plurality of first lines 35 and a plurality of second lines 36 crossing the first lines 35. The first lines 35 and the second lines 36 extend in a direction crossing both the first direction X and the second direction Y. The first lines 35 and the second lines 36 are connected to the first part P1, the second part P2, or both of them. The third part P3 having such first lines 35 and second lines 36 is another example of the above-described patterned structure.

In the example of FIG. 13, the width of the first line 35 and the width of the second line 36 are less than the width of the lead LN3.

The second part P2 has an opening 40 in the proximity of each connection point of both the first and second lines 35 and 36 and the second part P2. A plurality of the openings 40 may be formed more in the second direction Y as in the example of FIG. 9.

If the third part P3 is defined by the first line 35 and the second lines 36 as in this example, the parts where the overcoat layer OC and the second main surface 20B contact with each other can be dispersed in the proximity of the overlap area OL. Consequently, a possibility of detachment of the overcoat layer OC can further be decreased. Even if the resin material of the overcoat layer OC flows in the second direction Y, the resin material is trapped by the openings defined by the first lines 35 and the second lines 36. Furthermore, since the first part P1 and the second part P2 are connected through multiple paths, conduction between the first part P1 and the second part P2 is secured even if one of the lines 35 and 36 is cut for some reason.

Sixth Example

Figure 14:
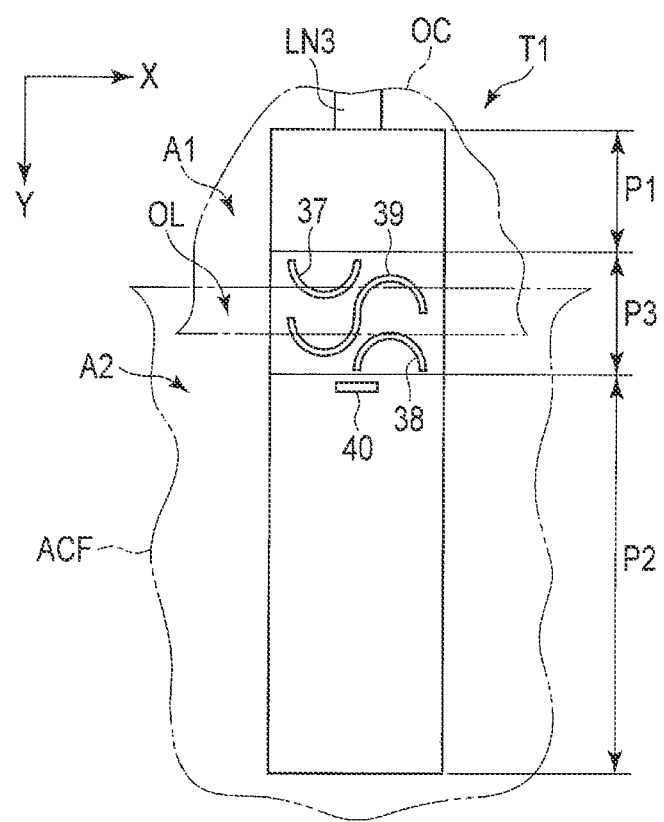
FIG. 14 shows a shape of the terminal of the sixth example.

FIG. 14 shows a shape of the first terminal T1 of the sixth example. The first terminal T1 includes a first part P1, second part P2, and third part P3 as in the first example.

In this example, the third part P3 has slits 37, 38, and 39. Each of the slits 37 and 38 is formed in an arc shape. The slit 39 is a combination of two semicircular slits arranged in the first direction X. The third part P3 having such slits 37, 38, and 39 is another example of the above-described patterned structure.

In the example of FIG. 14, the width of the slits 37, 38, and 39 is less than the width of the lead LN3.

The second part P2 has an opening 40 in the proximity of the center thereof in the first direction X. A plurality of the openings 40 may be formed more in the second direction Y as in the example of FIG. 9.

Even if the third part P3 includes slits 37, 38, and 39 as in this example, the area arrangement ratio of the metal material in the overlap area OL can be made small and the detachment of the overcoat layer OC can be prevented. Furthermore, even if the resin material of the overcoat layer OC flows in the second direction Y, the resin material is trapped by the slits 37, 38, and 39. In this example, the slits 37, 38, and 39 are formed in arc-like shapes, and the resin material is smoothly guided in different directions by the slits 37, 38, and 39. Consequently, the resin material hardly reaches the second part P2.

Figures 15, 16:
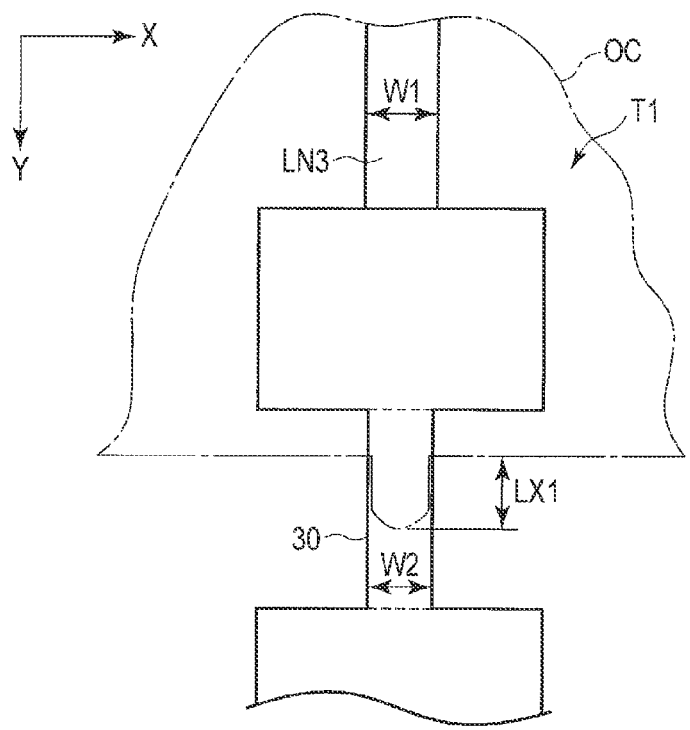
FIG. 15 shows an outline of the assessment of a width of a line of the terminal of the first example.
FIG. 16 is a table showing a result of the measurement of a length of the overcoat layer projecting on the line of the terminal of the first example.

With respect to the first terminal T1 of the first example, the inventors of the present application assessed a suitable width of the line 30 for prevention of the end shape irregularity of the overcoat layer OC. FIG. 15 shows an outline of the assessment. In this assessment, leads LN 3 and first terminals T1 were formed on a glass substrate, and an overcoat layer OC was formed thereon to measure a length LX1 of the overcoat layer OC projecting on the lines 30. Width W1 of the lead LN3 and width W2 of the line 30 were changed to obtain a plurality of examples.

FIG. 16 is a table showing a result of the measurement of the length LX1. The length LX1 was measured where width W1 of the lead LN3 was 100 µm and width W2 of the line 30 was changed in seven ways: 120, 105, 95, 50, 25, 18, and 10 µm. In these seven examples, the measured length LX1 was approximately 92, 85, 52, 30, 18, 2, and 1 µm, respectively. Furthermore, the length LX1 was measured where width W1 of the lead LN3 was 50 µm and width W2 of the line 30 was changed in seven ways: 60, 50, 40, 30, 20, 10, and 5 µm. In these seven examples, the measured length LX1 was approximately 71, 25, 19, 16, 12, 3, and 1 µm, respectively. The result indicates that the length LX1 decreases when width W2 of the line 30 decreases. Especially, if width W1 is 100 µm, the length LX1 steeply decreases when width W2 is decreased from 105 to 95 µm, and if width W1 is 50 µm, the length LX1 steeply decreases when width W2 is decreased from 60 to 50 µm. Therefore, by setting width W2 substantially the same as or less than width W1, the end shape irregularity of the overcoat layer OC can be greatly reduced.

Furthermore, if width W2 is less than approximately one fifth width W1 (W2/W1≤⅕), the length LX1 becomes significantly small. Therefore, by setting width W2 to a value satisfying this condition, the end shape irregularity of the overcoat layer OC can further be reduced.

Figures 17, 18:
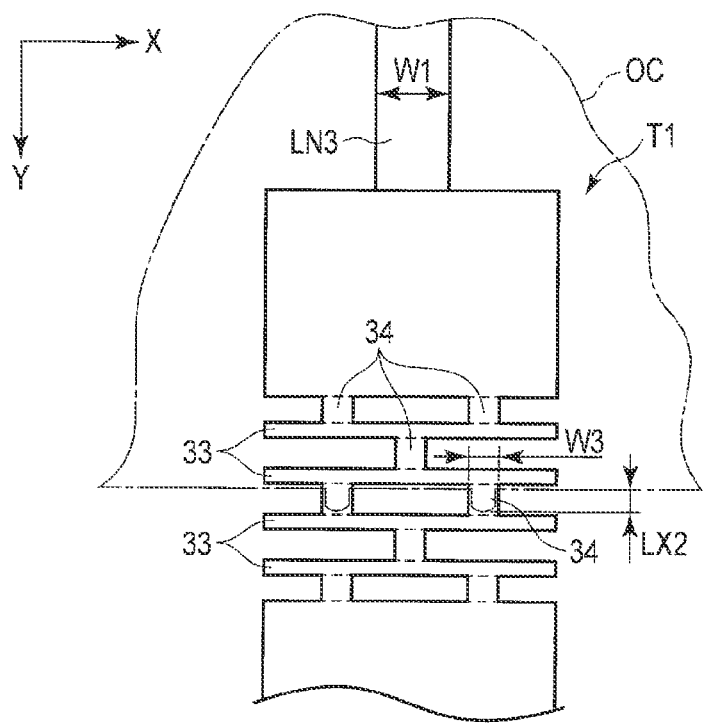
FIG. 17 shows an outline of the assessment of a width of a line of the terminal of the fourth example.
FIG. 18 is a table showing a result of the measurement of a length of the overcoat layer projecting on the line of the terminal of the fourth example.

With respect to the first terminal T1 of the fourth example, the inventors of the present application also performed the assessment in the same manner. FIG. 17 shows an outline of the assessment. In this assessment, the leads LN 3 and the first terminals T1 were formed on a glass substrate, and an overcoat layer OC was formed thereon to measure a length LX2 of the overcoat layer OC projecting on the connectors 34. Width W1 of the lead LN3 and width W3 of the connector 34 were changed to obtain a plurality of examples.

FIG. 18 is a table showing a result of the measurement of the length LX2. The length LX2 was measured where width W1 of the lead LN3 was 120 µm and width W3 of the connector 34 was changed in seven ways: 125, 115, 90, 50, 30, 15, and 10 µm. In these seven examples, the measured length LX2 was approximately 89, 65, 40, 29, 7, 1, and 0 µm, respectively. Furthermore, the length LX2 was measured where width W1 of the lead LN3 was 60 µm and width W3 of the connector 34 was changed in seven ways: 65, 55, 40, 30, 20, 10, and 5 µm. In these seven examples, the measured length LX2 was approximately 59, 24, 21, 20, 9, 1, and 0 µm, respectively. The result indicates that the length LX2 decreases when width W3 of the connector 34 decreases. Especially, if width W1 is 120 µm, the length LX2 steeply decreases when width W3 is decreased from 125 to 115 µm, and if width W1 is 60 µm, the length LX2 steeply decreases when width W3 is decreased from 65 to 55 µm. Therefore, by setting width W3 substantially the same as or less than width W1, the end shape irregularity of the overcoat layer OC can be greatly reduced.

Furthermore, if width W3 is less than approximately one fifth width W1 (W3/W1≤⅕), the length LX2 becomes significantly small. Therefore, by setting width W3 to a value satisfying this condition, the end shape irregularity of the overcoat layer OC can further be reduced.

Note that, with respect to the lines 31 of the second example, the lines 32 of the third example, and the first and second lines 35 and 36 of the fifth example, by setting the width of these lines to substantially the same as or less than width W1 of the lead LN3, the end shape irregularity of the overcoat layer OC can suitably be reduced.

The structure of the embodiment described above can be varied suitably. For example, the shape of the first terminal T1 is not limited to that of the first to sixth examples. Lines, slits, or combinations of lines and slits formed in various shapes can be used for the third part P3.

In the present embodiment, the sensor SE performs sensing using both detection electrodes and driving electrodes (referred to as a mutual capacitance detection method, or the like); however, the sensor may be of different kinds. For example, the sensor SE may perform sensing using the capacitance of the detection electrodes (referred to as a self capacitance detection method, or the like).

Furthermore, in the present embodiment, only the detection electrodes are disposed on the second main surface 20B of the second substrate SUB2. However, not only the detection electrodes, driving electrodes may also be disposed on the second main surface 20B of the second substrate SUB2. In that case, with respect to the first terminals T1 formed in the frame area FA, some terminals T1 are connected to the detection electrodes and the other terminals T1 are connected to the driving electrodes.

In the self capacitance detection method, sensor driving signals are supplied to each of the detection electrodes Rx and sensor output signals are read from each of the detection electrodes Rx. An object contacting or approaching the display area DA influences the capacitance of the detection electrodes Rx, and thus, the position of the object in the arrangement direction of the detection electrodes Rx can be detected based on the sensor output signals obtained from the detection electrodes Rx. The detection electrodes Rx may be formed in a matrix extending both the first direction X and the second direction Y in the display area DA. In that case, the position of the object can be detected two-dimensionally in the first direction X and the second direction Y.

In the present embodiment, the sensor SE is a so-called in-cell sensor which uses the common electrodes CE of the liquid crystal display panel PNL. However, the sensor SE may include, separately from the common electrodes CE, driving electrodes and detection electrodes Rx disposed outside the liquid crystal display panel PNL. In that case, the driving electrodes and the detection electrodes Rx may be disposed to be opposed to each other with the insulating layer interposed therebetween, or may be disposed alternately on the same layer.

In the present embodiment, the detection electrode Rx and the lead LN3 are formed of a metal material as with the first terminal T1. However, either the detection electrode Rx or the lead LN3, or both may be formed of a transparent conductive material such as ITO. Furthermore, the lead LN3 and the first terminal T1 may be formed of a layered structure of a transparent conductive material such as ITO and a metal material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXPLANATION OF REFERENCES

DSP: Liquid crystal display device; PNL: Liquid crystal display panel; SE: Sensor; Rx: Detection electrode; DA: Display area; LC: liquid crystal layer; CE: Common electrode; OC: Overcoat layer; RC: Detection circuit; T1: First terminal; T2: Second terminal; ACF: Anisotropy conductive layer; OL: Overlap area; A1: First area; A2: Second area; P1: First part; P2: Second part; P3: Third part; FPC2: flexible printed circuit; LN3: lead; 20: Second insulating substrate; 30: line; 40: Opening.

The invention claimed is:
1. A detection device, comprising:
a substrate;
a detection electrode formed on a main surface of the substrate, the detection electrode used for detection of an object contacting or approaching the substrate;
a terminal formed of a metal material on the main surface of the substrate;
a lead formed on the main surface of the substrate, the lead electrically connecting the detection electrode and the terminal;
a coating layer covering the detection electrode, the lead, and a part of the terminal;
a conductive adhesion layer covering a part of the terminal exposed from the coating layer, the conductive adhesion layer covering a part of the coating layer; and
a circuit board electrically connected to the terminal with the conductive adhesion layer interposed therebetween, wherein
at least in an overlapping area where the conductive adhesion layer covers the coating layer, an area of the metal material of the terminal per unit area is smaller than that of the other area of the terminal.
2. The detection device of claim 1, wherein the terminal is formed such that the metal material is partly removed therefrom at least in the overlapping area.
3. The detection device of claim 1, wherein the terminal includes a line in the overlapping area, the line having a second width which is less than a first width of the lead.
4. The detection device of claim 3, wherein the line meanders or bends.
5. The detection device of claim 3, wherein the terminal includes a plurality of the lines crossing each other.
6. The detection device of claim 1, wherein the terminal comprises:
a plurality of lines extending in a first direction and arranged at intervals in a second direction crossing the first direction; and
a connector disposed in each gap between the lines for connection thereof.
7. The detection device of claim 6, wherein the connector has a third width which is less than a first width of the lead.
8. The detection device of claim 1, wherein the terminal includes a slit in the overlapping area.
9. The detection device of claim 3, wherein the terminal comprises:

a first part covered with the coating layer;
a second part covered with the conductive adhesion layer; and
a third part including the line, the third part at least partly overlapping with the overlapping area and connecting the first part and the second part.

10. The detection device of claim 9, wherein the second part has an opening on an extension line of the line.

11. A display device with a detection function, comprising:
a display panel including a display element, a plurality of first electrodes disposed in respective pixels in a display area, and a second electrode opposed to the first electrodes, the display panel configured to display an image in the display area by selectively applying a voltage between the first electrode and the second electrode to drive the display element;
a detection electrode formed on an outer surface of the display panel, the detection electrode used for detection of an object contacting or approaching the display area;
a terminal formed of a metal material on the outer surface of the display panel;
a lead formed on the outer surface of the display panel, the lead electrically connecting the detection electrode and the terminal;
a coating layer covering the detection electrode, the lead, and a part of the terminal;
a conductive adhesion layer covering a part of the terminal exposed from the coating layer and covering a part of the coating layer;
a circuit board electrically connected to the terminal with the conductive adhesion layer interposed therebetween; and
a detection circuit configured to detect the object based on a second signal output from the detection electrode to the circuit board through the lead and the terminal when a first signal for detection of the object is supplied to the second electrode, wherein
at least in an overlapping area where the conductive adhesion layer covers the coating layer, an area of the metal material of the terminal per unit area is smaller than that of the other area of the terminal.

12. The display device of claim 11, wherein the terminal is formed such that the metal material is partly removed therefrom at least in the overlapping area.

13. The display device of claim 11, wherein the terminal includes a line in the overlapping area, the line having a second width which is less than a first width of the lead.

14. The display device of claim 13, wherein the line meanders or bends.

15. The display device of claim 13, wherein the terminal includes a plurality of the lines crossing each other.

16. The display device of claim 11, wherein the terminal comprises:
a plurality of lines extending in a first direction and arranged at intervals in a second direction crossing the first direction; and
a connector disposed in each gap between the lines for connection thereof.

17. The display device of claim 16, wherein the connector has a third which is less than a first width of the lead.

18. The display device of claim 11, wherein the terminal includes a slit in the overlapping area.

19. The display device of claim 13, wherein the terminal comprises:
a first part covered with the coating layer;
a second part covered with the conductive adhesion layer; and
a third part including the line, the third part at least partly overlapping with the overlapping area and connecting the first part and the second part.

20. The display device of claim 19, wherein the second part has an opening on an extension line of the line.

* * * * *